(12) United States Patent
Nakahara et al.

(10) Patent No.: US 8,791,521 B2
(45) Date of Patent: Jul. 29, 2014

(54) SEMICONDUCTOR DEVICE AND METHOD OF MANUFACTURING THE SAME

(75) Inventors: Koji Nakahara, Aichi (JP); Kazuhiro Matsuo, Mie (JP); Masayuki Tanaka, Kanagawa (JP); Hirofumi Iikawa, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 165 days.

(21) Appl. No.: 13/423,664

(22) Filed: Mar. 19, 2012

(65) Prior Publication Data

US 2013/0069135 A1 Mar. 21, 2013

(30) Foreign Application Priority Data

Sep. 20, 2011 (JP) ................................. 2011-204561

(51) Int. Cl.
*H01L 29/788* (2006.01)
(52) U.S. Cl.
USPC ........... 257/316; 257/320; 257/324; 257/326; 438/261; 438/257
(58) Field of Classification Search
USPC ......... 257/315, 316, 320, 324, 296, 314, 326, 257/321; 438/261, 201, 211, 257
See application file for complete search history.

(56) References Cited

U.S. PATENT DOCUMENTS

| 8,022,467 B2 | 9/2011 | Iikawa et al. | |
| 2007/0215929 A1* | 9/2007 | Yasuda | 257/314 |
| 2007/0262372 A1* | 11/2007 | Yamamoto et al. | 257/324 |
| 2009/0078984 A1* | 3/2009 | Nagano et al. | 257/316 |
| 2009/0096006 A1* | 4/2009 | Tanaka et al. | 257/316 |
| 2009/0173989 A1* | 7/2009 | Yaegashi | 257/320 |

FOREIGN PATENT DOCUMENTS

| JP | 2007-305668 | 11/2007 |
| JP | 2008-078317 | 4/2008 |
| JP | 2008-098510 | 4/2008 |
| JP | 2010-283127 | 12/2010 |

OTHER PUBLICATIONS

U.S. Appl. No. 13/237,486, filed Sep. 20, 2011, Kazuhiro Matsuo, et al.
Office Action dated Jan. 28, 2014, issued in Japanese Patent Application No. 2011-204561 (with English translation).

* cited by examiner

*Primary Examiner* — Thanh Y Tran
(74) *Attorney, Agent, or Firm* — Oblon, Spivak, McClelland, Maier & Neustadt, L.L.P.

(57) ABSTRACT

A semiconductor device includes an interelectrode insulating film formed between a charge storage layer and a control electrode layer. The interelectrode insulating film is formed in a first region above an upper surface of an element isolation insulating film, a second region along a sidewall of the charge storage layer, and a third region above an upper surface of the charge storage layer. The interelectrode insulating film includes a first stack including a first silicon nitride film or a high dielectric constant film interposed between a first and a second silicon oxide film or a second stack including a second high dielectric constant film and a third silicon oxide film, and a second silicon nitride film formed between the control electrode layer and the first or the second stack. The second silicon nitride film is relatively thinner in the third region than in the first region.

7 Claims, 7 Drawing Sheets

FIG. 6

SEMICONDUCTOR DEVICE AND METHOD OF MANUFACTURING THE SAME

CROSS-REFERENCE TO RELATED APPLICATION(S)

This application is based upon and claims the benefit of priority from Japanese Patent Application No. 2011-204561, filed on, Sep. 20, 2011 the entire contents of which are incorporated herein by reference.

FIELD

Embodiments disclosed herein generally relate to a semiconductor device and a method of manufacturing the same.

BACKGROUND

A flash memory is typically configured by an array of multiplicity of memory cells aligned in the word line direction and the bit line direction. A memory cell is configured by a stacked gate structure in which a floating gate electrode, interelectrode insulating film, and control gate electrode are stacked in the listed sequence. As flash memory increases its storage capacity through densification, features within the memory cell are packed in tighter dimensions. Dimensions typically affected by the densification are widths of floating gate electrodes and element isolation trenches.

As the memory cells become smaller, relatively higher electric field is applied to the floating gate electrode through the interelectrode insulating film during programming. This is because downscaling of a memory cell often results in a floating gate electrode with a sharp tip. Because electric field tends to concentrate at the tips, edges, and corners, the downscaled floating gate having relatively larger percentage of such high electric field regions are subjected to larger amount of high electric field leakage current which prevents the memory cell from being programmed to the desired threshold.

The interelectrode insulating film is often configured by an ONO structure in which a silicon nitride film is interposed between the top silicon oxide film and the bottom silicon oxide film. The silicon nitride film in the middle layer of the stack traps electrons that positively affect the programming properties of the cell. As the element isolation trenches become narrower, the electrons trapped in the silicon nitride film of the interelectrode insulating film formed above the element isolation insulating film cause a shift in the programming threshold of the adjacent cell, which typically causes programming errors.

DETAILED DESCRIPTION

In one embodiment, a semiconductor device is disclosed. The semiconductor device includes a semiconductor substrate; an element isolation region defined in the semiconductor substrate and having an element isolation insulating film formed therein; an active region defined in the semiconductor substrate delineated by the element isolation region; a gate insulating film formed in the active region; a charge storage layer formed above the gate insulating film; a multilayered interelectrode insulating film formed in a first region above an upper surface portion of the element isolation insulating film, a second region along a sidewall portion of the charge storage layer, and a third region above an upper surface portion of the charge storage layer; and a control electrode layer formed above the interelectrode insulating film. The interelectrode insulating film comprises a first stack including a first silicon nitride film or a first high dielectric constant film interposed between a first silicon oxide film and a second silicon oxide film formed above the first silicon oxide film or a second stack including a second high dielectric constant film and a third silicon oxide film formed above the second high dielectric constant film, and a second silicon nitride film formed between the control electrode layer and the first or the second stack. The second silicon nitride film is relatively thinner in the third region than in the first region.

In one embodiment, a method of manufacturing a semiconductor device is disclosed. The method includes forming a gate insulating film above a semiconductor substrate; forming a charge storage layer above the gate insulating film; forming an element isolation trench into the charge storage layer, the gate insulating film, and the semiconductor substrate; filling the element isolation trench with an element isolation insulating film; exposing an upper surface and an upper sidewall of the charge storage layer; forming, in a first region above an upper surface portion of the element isolation insulating film, a second region along a sidewall portion of the charge storage layer, and a third region above an upper surface portion of the charge storage layer, a multilayered interelectrode insulating film comprising a first stack including a first silicon nitride film or a first high dielectric constant film interposed between a first silicon oxide film and a second silicon oxide film formed above the first silicon oxide film or a second stack including a second high dielectric constant film and a third silicon oxide film formed above the second high dielectric constant film, and a second silicon nitride film formed above the first or the second stack; and forming a control electrode layer above the interelectrode insulating film. In forming the interelectrode insulating film, the second silicon nitride film formed in the third region is locally oxidized.

Embodiments are described hereinafter with reference to the accompanying drawings. Elements that are identical or similar are represented by identical or similar reference symbols across the figures. The drawings are not drawn to scale and thus, do not reflect the actual measurements of the features such as the correlation of thickness to planar dimensions and the relative thickness of different layers.

Figure 1:
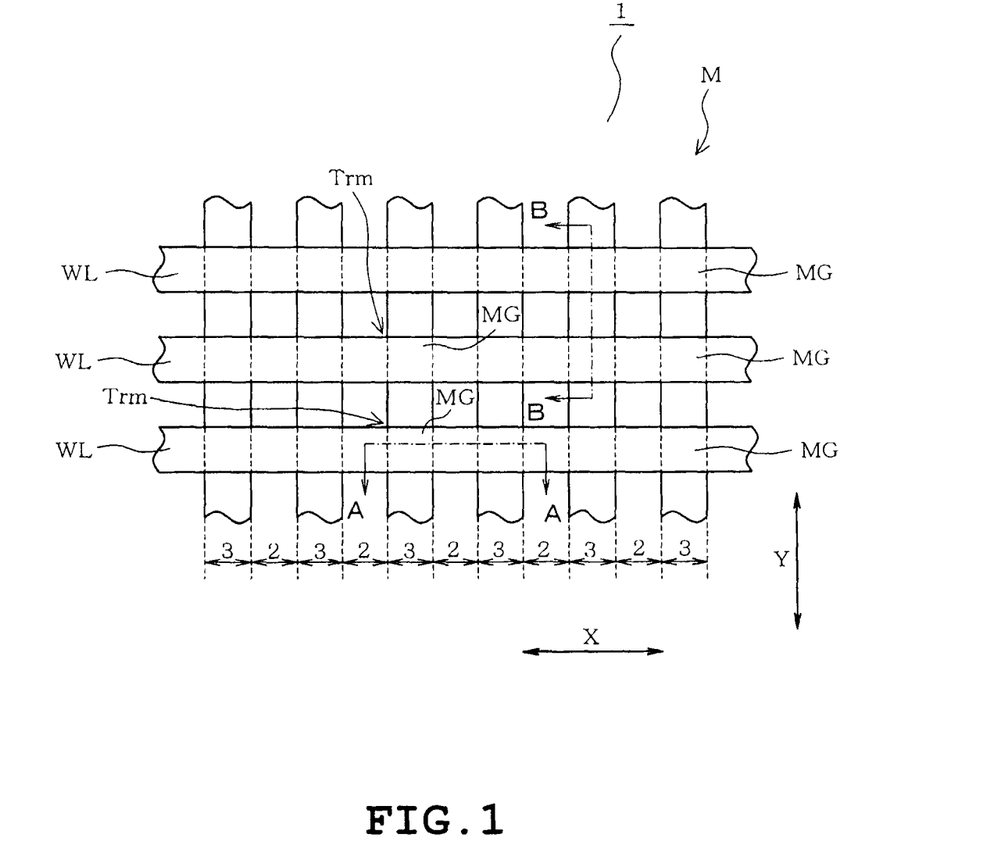
FIG. 1 schematically illustrates the planar structure of a memory cell region of a first embodiment.

A first embodiment of a semiconductor device is described through an example of a nonvolatile semiconductor storage device. FIG. 1 schematically illustrates the planar structure of a memory cell region of the nonvolatile semiconductor storage device. As shown in FIG. 1, memory cell region M contains multiplicity of memory cell transistors Trm in a matrix alignment along the word line WL direction X and the bit line direction Y. A peripheral circuit not shown reads, programs, and erases the data stored in memory cell transistors Trm. NAND flash memory is a typical example of a nonvolatile semiconductor storage device employing such memory cell structure. NAND flash memory is typically configured by an array of NAND strings or units of cells in which a plurality of memory cell transistors Trm are series connected between a pair select transistors not shown.

Figure 2A:
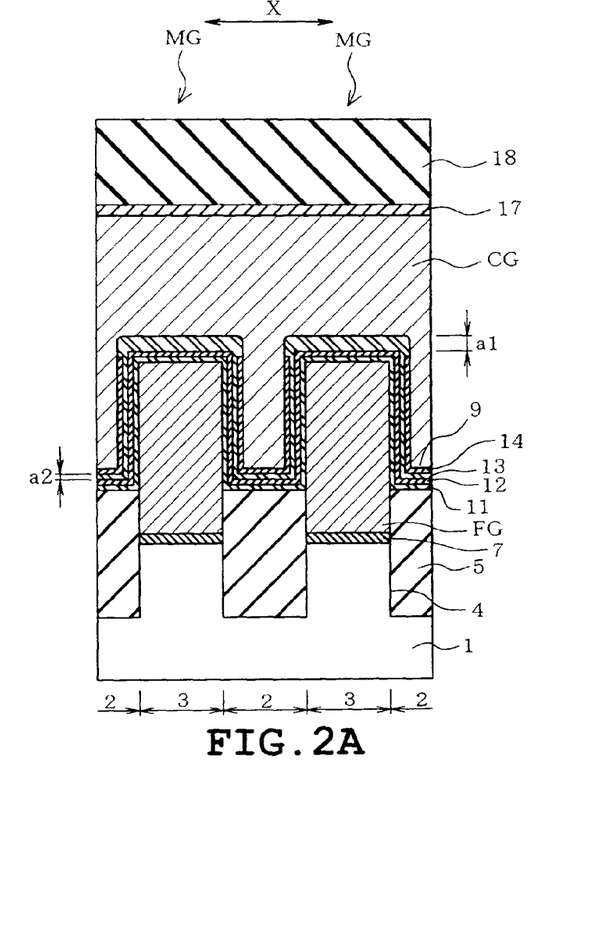
FIG. 2A is a cross sectional view taken along line A-A of FIG. 1.
Figure 2B:
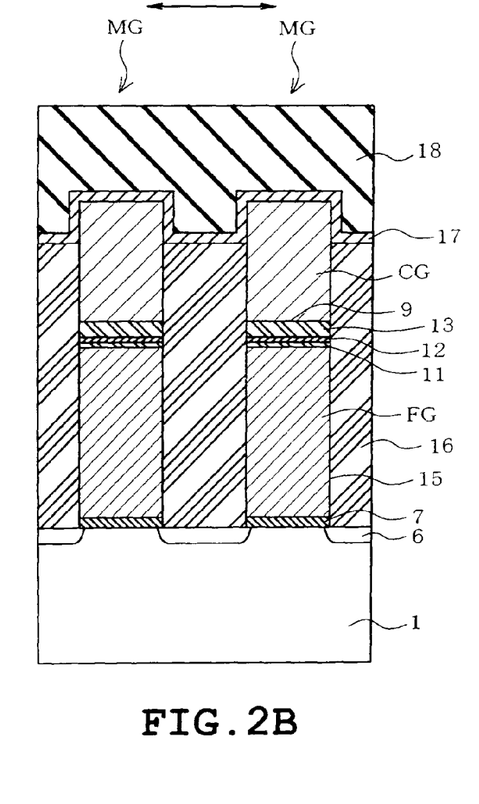
FIG. 2B is a cross sectional view taken along line B-B of FIG. 1.

FIG. 2A is a cross sectional view taken along line A-A of FIG. 1 which extends along word line WL and the width direction of the channel of each memory cell. FIG. 2B is a cross sectional view taken along line B-B of FIG. 1 which extends along the bit line and the length direction of the channel of each memory cell. The gate electrode structure within memory cell region M of the first embodiment is discussed with reference to FIGS. 2A and 2B.

As can be seen in FIGS. 2A and 2B the P-type silicon substrate 1 has element isolation trenches 4 formed in its surface layer. Element isolation trenches 4 isolate multiplicity of active regions 3 in word line WL direction represented as the X direction as viewed in FIG. 1. Each element isolation trench 4 is filled with element isolation insulating film 5 to form element isolation region 2 employing an STI (Shallow Trench Isolation) scheme.

Memory cell transistor Trm includes an n-type diffusion layer 6 formed in silicon substrate 1, gate insulating film 7 formed above silicon substrate 1, and gate electrode MG formed above gate insulating film 7. Gate electrode MG includes floating gate electrode FG serving as a charge storage layer, interelectrode insulating film 9 formed in the region above the upper surface of floating gate electrode FG, and control gate electrode CG serving as a control electrode layer. Diffusion layer 6 is formed in the surface layer of silicon substrate 1 situated beside gate electrode MG of memory cell transistor Trm and serves as the source/drain region of memory cell transistor Trm.

Gate insulating film 7 also referred to as tunnel insulating film 7, is formed in active region 3 which is delineated by element isolation insulating film 5 filled in the element isolation trenches 4. Gate insulating film 7 typically comprises a silicon oxide film. Floating gate electrode FG formed above gate insulating film 7, serving as a charge storage layer as described earlier, typically comprises polycrystalline silicon layer 8 also referred to as conductive layer 8 doped with impurities such as phosphorous.

Interelectrode insulating film 9 takes a multilayered ONON structure in which a layer of first silicon oxide film 11, a layer of first silicon nitride film 12, a layer of second silicon oxide film 13 and a layer of second silicon nitride film 14 are stacked in the listed sequence in the region above the upper surface of element isolation insulating film 5 and the sidewall and the upper surface of floating gate electrode FG. Interelectrode insulating film 9 may also be referred to as an interpoly insulating film and inter-conductive-layer insulating film. Second silicon nitride film 14 in the uppermost layer of interelectrode insulating film 9 is dissipated from the region above the upper surface of floating gate electrode FG by local oxidation, as later described, which in turn forms a silicon oxide film. Thus, a thick layer of silicon oxide film resulting from the combination of the silicon oxide film and the underlying second silicon oxide film 13 resides above upper the surface of floating gate electrode FG as can be seen in FIG. 2A. In FIG. 2A, silicon oxide film 13 is shown to have thickness a1 in the region above the upper surface of floating gate electrode FG which is thicker as compared to the remaining portions shown to have thickness a2.

Control gate electrode CG formed above interelectrode insulating film 9 comprises conductive layer 10. In other words, conductive layer 10 serves globally as word line WL extending across the memory cell array and locally as control gate electrode CG for each memory cell. Conductive layer 10 is typically configured as a stack of a polycrystalline silicon layer doped with impurities such as phosphorous and a silicide layer residing directly on top of the polycrystalline silicon layer. The silicide layer comprises a silicide of either of metals such as tungsten (W), cobalt (Co), and nickel (Ni). The silicide layer of the first embodiment employs a nickel silicide (NiSi). In an alternative embodiment, conductive layer 10 may be fully silicided.

As can be seen in FIG. 2B, gate electrodes MG of memory cell transistors Trm are electrically isolated in the Y direction by gaps 15. Gaps 15 are filled with inter-memory-cell insulating film 16 which typically comprises a silicon oxide film such as TEOS (tetraethyl orthosilicate) or a low dielectric constant insulating film.

Above the upper surface of inter-memory-cell insulating film 16, and the upper surface and the upper sidewall of control gate electrode CG, liner insulating film 17 is formed which comprises, for example, a silicon nitride film. Further above liner insulating film 17, interlayer insulating film 18 is formed which typically comprises a silicon oxide film. Liner insulating film 17 serves as a barrier to keep the oxidant used in the formation of interlayer insulating film 18 away from control gate electrode CG. One of the advantages of providing liner insulating film 17 is that it prevents oxidation of the silicide layer of conductive layer 10 which may cause elevation in the resistance level of word line WL. Because liner insulating film 17, comprising a silicon nitride film in the first embodiment, does not fully fill gap 15 between control gate electrodes CG, the risk of increased parasitic capacitance that may lead to wiring delay can be minimized.

The above described nonvolatile semiconductor storage device is configured to erase/program the data stored in the memory cell by applying high electric field, drawn from the peripheral circuit not shown, between word line WL and P-well of silicon substrate 1 as well as applying suitable predetermined voltage on electric elements such as the source and drain. For instance, when programming, the peripheral circuit applies a high level voltage on the selected word line WL while applying a low level voltage on P-well, etc., provided in silicon substrate 1. When erasing, the peripheral circuit applies a low level voltage on the selected word line WL while applying a high level voltage on P-well, etc. of silicon substrate 1.

Figure 3A:
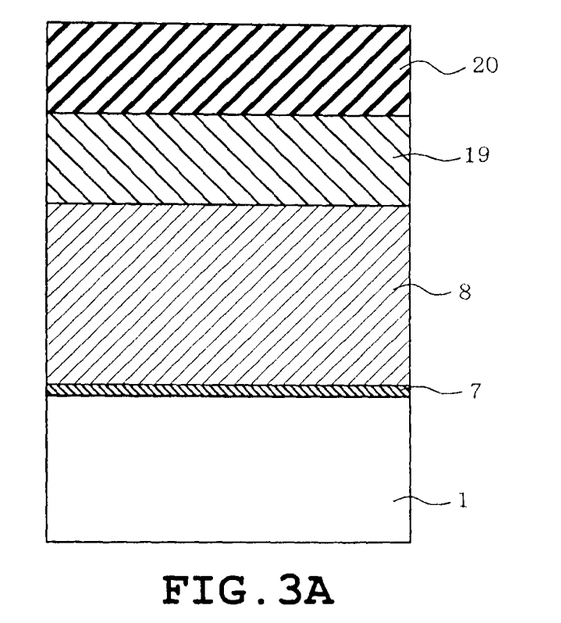
FIGS. 3A, 3B, 3C, 3D, 3E, 3F, and 3G each depict a cross section taken along line A-A of FIG. 1 and illustrate one phase of a manufacturing process flow of the memory cell region.
Figure 3B:
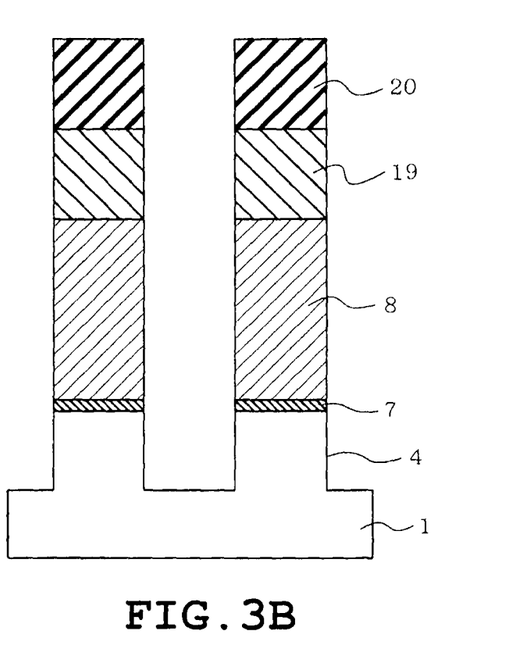
Figure 3C:
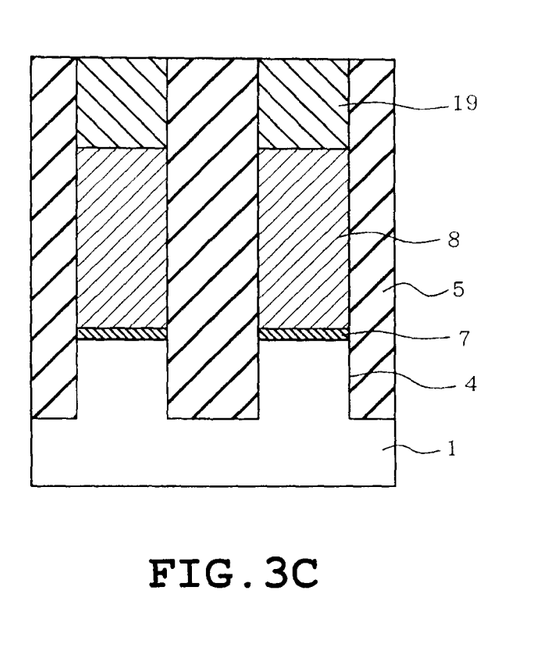
Figure 3D:
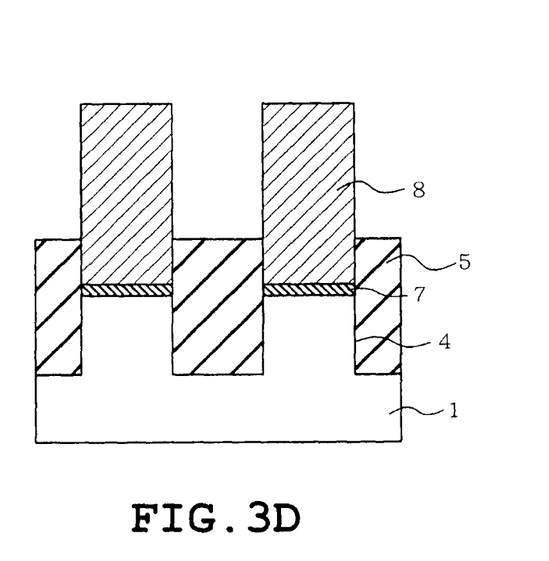
Figure 3E:
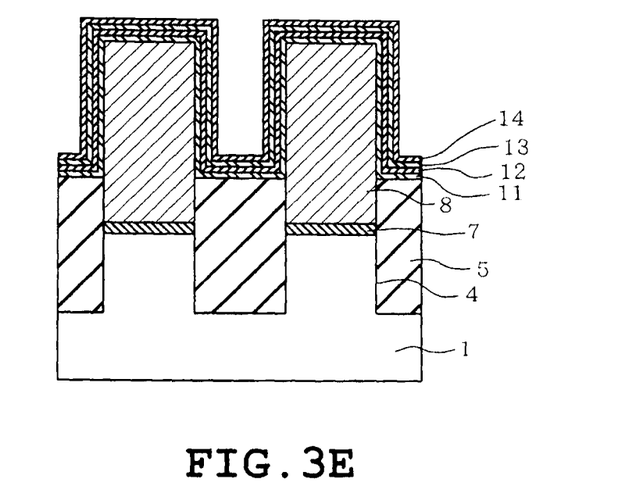
Figure 3F:
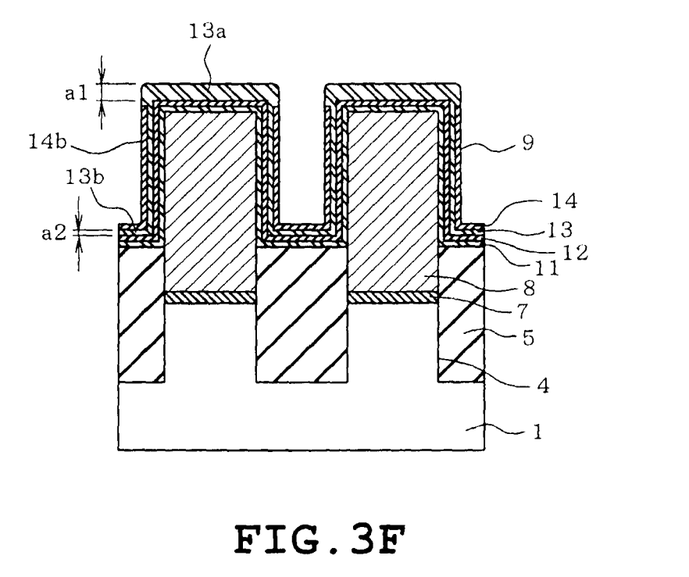
Figure 3G:
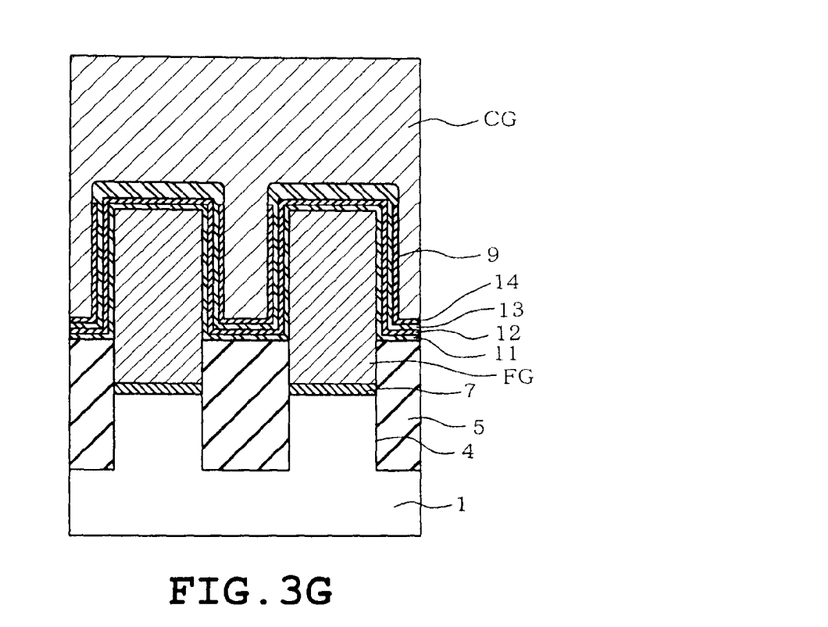
Figure 4:
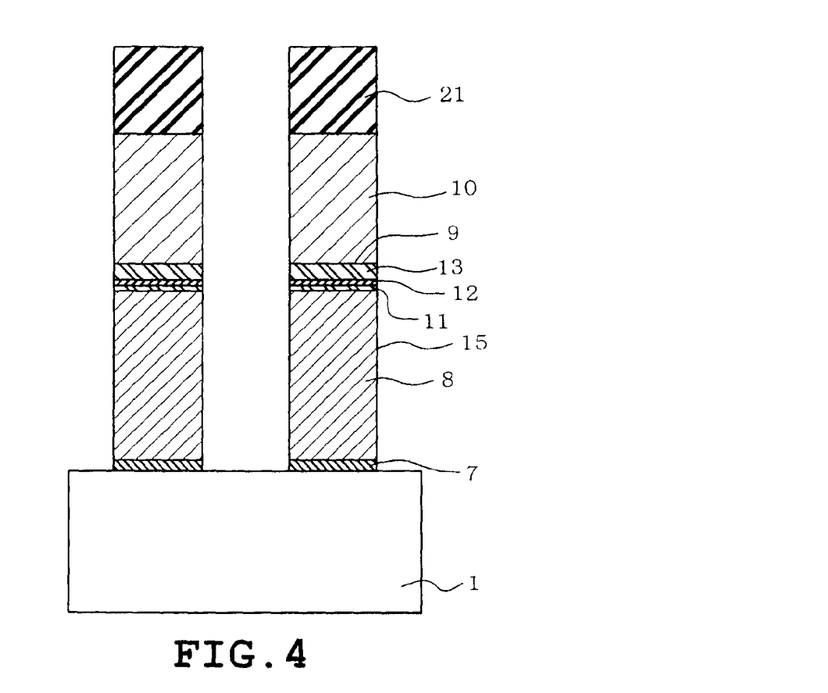
FIG. 4 depicts a cross section taken along line B-B of FIG. 1 and illustrates one phase of a manufacturing process flow of the memory cell region.

Referring to FIGS. 3A to 3G and FIG. 4, a description will be given on the process flow for manufacturing the above described nonvolatile semiconductor storage device. FIGS. 3A to 3G are schematic cross sectional views of memory cell region M taken along line A-A of FIG. 1 at different stages of the manufacturing process flow. FIG. 4 is a cross sectional view of memory cell region M taken along line B-B of FIG. 1.

Referring to FIG. 3A, approximately 6 nm of gate insulating film 7 is formed above the upper surface of silicon substrate 1 which is doped with impurities. Gate insulating film 7 serves as a tunnel insulating film. Then, above gate insulating film 7, approximately 100 nm of polycrystalline silicon layer 8 doped with phosphorus is formed by CVD (Chemical Vapor Deposition). Polycrystalline silicon layer 8, as described earlier, constitutes floating gate electrode FG that serves the charge storage layer.

Then, silicon nitride film 19 later used as a mask is formed by CVD which is followed by CVD formation of another mask made of silicon oxide film 20. Silicon oxide film 20 is thereafter coated with a photoresist not shown which is subsequently patterned through exposure and development.

Then, using the patterned photoresist as a mask also referred to as a first resist mask hereinafter, the underlying silicon oxide film 20 is etched by RIE (Reactive Ion Etching). Photoresist is thereafter removed and silicon oxide film 20 is further used as a mask to etch the underlying silicon nitride film 19 by RIE, which is in turn used as a mask to etch polycrystalline silicon layer 8, gate insulating film 7, and silicon substrate 1 to form element isolation trench 4 as can be seen in FIG. 3B. According to the first embodiment, the widths of both active region 3 and element isolation trench 4 are configured at approximately 50 nm.

Then, element isolation trench 4 is overfilled with element isolation insulating film 5 such that the overflow of element isolation insulating film 5 is further blanketed over silicon oxide film 20. Element isolation insulating film 5 comprises a silicon oxide film typically formed by SOG (Spin On Glass) materials such as polysilazane. Then, silicon oxide film 20 is thereafter polished away by CMP (Chemical Mechanical Polishing) using the underlying silicon nitride film 19 as a polish stop to remove the excess element isolation insulating film 5 while leaving element isolation insulating film 5 within element isolation trench 4 as shown in FIG. 3C.

Then, silicon nitride film 19, used as an etch mask and a polish stop, is removed by wet etching to expose the upper surface of polycrystalline silicon layer 8. Further, the upper portion of element isolation insulating film 5 is removed by wet etching typically employing a solution of diluted hydrofluoric acid. The element isolation insulating film 5 in memory cell region M in particular is etched until approximately 50 nm of the upper sidewall of polycrystalline silicon layer 8 is exposed to obtain the structure shown in FIG. 3D.

Next, interelectrode insulating film 9 is blanketed above the underlying structure i.e. upper surface of element isolation insulating film 5, and the upper sidewall and the upper surface of polycrystalline silicon layer 8 later formed into floating gate electrode FG. More specifically, first silicon oxide film 11, first silicon nitride film 12, and second silicon oxide film 13 are stacked in the listed sequence typically by LP-CVD (Low Pressure Chemical Vapor Deposition) as shown in FIG. 3E. Then, second silicon nitride film 14 is formed, for instance, by radical nitridation to serve as the uppermost layer of the ONON stack.

The radical nitridation employed in forming second silicon nitride film 14 generates plasma using microwaves in a nitrogen gas containing atmosphere to cause reaction of nitrogen radicals and nitrogen ions that produce a silicon nitride film.

Then, as shown in FIG. 3F, second silicon nitride film 14 located in the region above the upper surface of floating gate electrode FG is locally oxidized as described earlier and dissipated to forma silicon oxide film in this region. The formed silicon oxide film is combined with the underlying silicon oxide film 13 to result in a thick silicon oxide film 13 having thickness a1 in the region above the upper surface of floating gate electrode FG which is thicker than the remaining sections 13b having thickness a2.

The local oxidation of second silicon nitride film 14 located in the region above the upper surface of floating gate electrode FG will be described in detail. The first embodiment employs plasma oxidation in locally oxidizing second silicon nitride film 14. To elaborate on the plasma oxidation, plasma is generated using microwaves in an oxygen gas containing atmosphere controlled to low pressures ranging from 10 to 300 Pa that produce oxygen radicals and oxygen ions for locally oxidizing second silicon nitride film 14. The parameters of the plasma oxidation include microwave intensity ranging between 500 to 5000 W and silicon substrate temperature ranging between room temperature to 800 degrees Celsius. For improved film formation rate, an oxidant may be used which is produced by the reaction of hydrogen gas with oxygen gas. In such case, the flow rate of hydrogen gas within the mixture of oxygen gas and hydrogen gas may range between 0.01 to 30%.

The local oxidation forms second silicon oxide film 13 which is relatively thick in the region above the upper surface of floating gate electrode FG, as represented by portion 13a in FIG. 3F. The local oxidation also partially dissipates, in this case, lowers second silicon nitride film 14 located along the sidewall of floating gate electrode FG as represented by portion 14b in FIG. 3F. The amount of the oxidation, which is reflected in the foregoing location based dimensions of second silicon oxide film 13 and second silicon nitride film 14, can be controlled by fine tuning the recipe of the plasma oxidation.

After forming interelectrode insulating film 9, a phosphorous-doped polycrystalline silicon layer 10 serving as control gate electrode CG is formed by LP-CVD in the thickness of approximately 100 nm. Thus, the resulting control gate electrode CG is placed in direct contact with second silicon oxide film 13 in the region above the upper surface of floating gate electrode FG, with second silicon nitride film 14 in the region above element isolation insulating film 5, and with second silicon nitride film 14 in the region along the sidewall of floating gate electrode FG.

Referring now to FIG. 4, silicon nitride film 21 is formed above polycrystalline silicon layer 10 by CVD that serves as a mask in the subsequent RIE. Further above silicon nitride film 21, a second resist mask not shown is formed which contains patterns that are oriented orthogonal to the patterns of the first resist mask mentioned earlier. Then, using the second resist mask, silicon nitride film 21, polycrystalline silicon layer 10, interelectrode insulating film 9, polycrystalline silicon layer 8, and gate insulating film 7 are etched in the listed sequence to form gap 15 for electrode isolation as shown in FIG. 4. The above series of processes form the stacked gate structure composed of floating gate electrode FG, interelectrode insulating film 9, and control gate electrode CG. The width of each stacked gate structure as well as the spacing between the stacked gate structures are approximately 50 nm.

Then, a spacer film not shown being approximately 10 nm thick is formed along the sidewall of the gate structure by thermal oxidation and CVD. Using the spacer film as a mask, impurity diffusion layer 6 shown in FIG. 2B, serving as the source/drain region, is formed by ion implantation and thermal anneal. Then, within gap 15, inter-memory-cell insulating film 16 shown in FIG. 2B is formed which is thereafter planarized and lowered in elevation. Further, the upper portion of polycrystalline silicon layer 10 is formed into a nickel silicide layer, followed by formation of liner insulating film 17 and interlayer insulating film 18 as shown in FIG. 2B. Then, known techniques are used to form interconnects, etc. not shown.

The end result of the above described process flow provides a nonvolatile semiconductor storage device configured by gate insulating film 7 formed above silicon substrate 1, floating gate electrode FG formed above gate insulating film 7, interelectrode insulating film 9 formed in the region above the upper surface of floating gate electrode FG, control gate electrode CG formed above interelectrode insulating film 9, and impurity diffusion layer 6 formed beside the channel region located below floating gate electrode FG.

Each of the memory cells of such nonvolatile semiconductor storage device is typically erased/programmed by applying a high level voltage between silicon substrate 1 and control gate electrode CG, whereby electric field intensified in correlation with the coupling ratio is applied to gate insulating film 7 to cause tunneling current to flow through gate insulating film 7. Responsively, amount of stored charge within floating gate electrode FG is varied, causing a shift in the threshold voltage to either program or erase the memory cell. In operation, multiplicity of memory cells are aligned in a matrix along word lines WL and the bit lines. One application of the nonvolatile semiconductor storage device configured as described above is a NAND flash memory in which a plurality of series connected memory cells are disposed between select transistors.

Next, a description will be given on the structure, operation and the advantages of interelectrode insulating film 9 configured as set forth in the first embodiment. Interelectrode insulating film 9 is configured such that second silicon oxide film 13 located in the region above the upper surface of floating gate electrode FG establishes direct contact with control gate electrode CG, whereas in the region above the upper surface of element isolation insulating film 5, second silicon nitride film 14 establishes direct contact with control gate electrode CG. That is, second silicon nitride film 14 at the uppermost layer of ONON stack is removed in the region above the upper surface of floating gate electrode FG by local oxidation to obtain a thick silicon oxide film 13 in this region as shown in FIG. 4. The thick silicon oxide film 13 advantageously reduces the level of leakage current observed in interelectrode insulating film 9. In contrast, second silicon nitride film 14 located in the region above the upper surface of element isolation insulating film 5 is maintained to establish a direct contact with control gate electrode CG, as shown in FIG. 3G. Thus, silicon nitride film 14 serves as a barrier during the erase operation to suppress electron trapping in the first silicon nitride film 12 located in the region above the upper surface of element isolation insulating film 5. The suppressed electron trapping in the region above element isolation insulating film 5 inhibits threshold shifting of the adjacent cell which in turn reduces the risk of erroneous programming of unintended cells and thereby improving the programming properties of the memory cell region M.

As the gate structures are narrowed by miniaturization, curvature at the top of floating gate electrode FG may be increased into a pointed tip. When subjected to high electric field during programming, electric field concentrates locally around the tip, consequently increasing the high field leakage current observed in interelectrode insulating film 9. Even when the upper surface of floating gate electrode FG is flat, electric field concentrates around the edges and the corners of the upper surface of floating gate electrode FG. Thus, the flow of leakage current in interelectrode insulating film 9 observed during programming increases at the tips, corners, and edges of the top portion or the upper surface of floating gate electrode FG.

Figure 5:
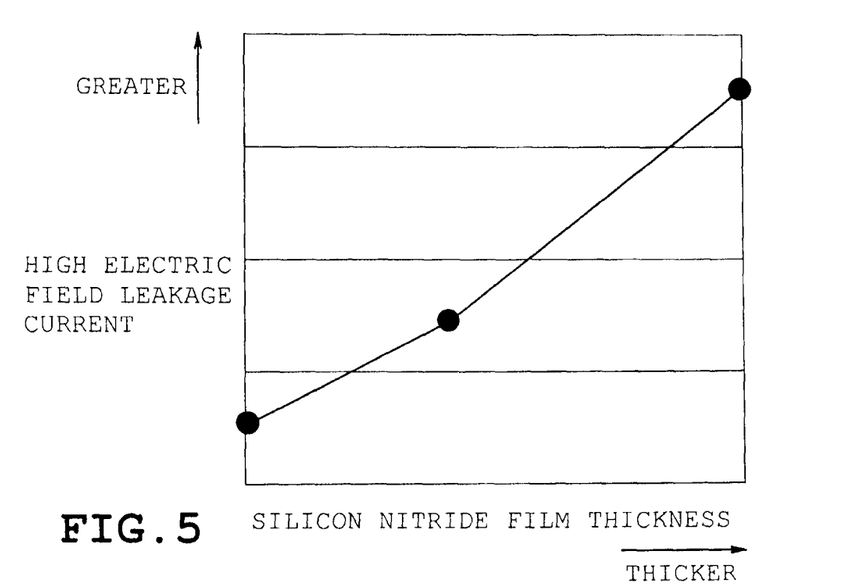
FIG. 5 is a chart plotting the thickness of a silicon nitride film against the level of high electric field leakage current.

FIG. 5 is a chart that shows how the density of leakage current flowing from the floating gate electrode side to the control gate electrode side varies with the thickness of silicon nitride film nearest to the control gate electrode in a stacked interelectrode insulating film. The silicon nitride film, in this case, may be in direct contact with the control gate electrode or may be separated from the control gate electrode by a thin silicon oxide film on the order of 1 nm or thinner. It can be understood from FIG. 5 that thinning the silicon nitride film in the proximity or in contact with the control gate electrode reduces the level of high electric field leakage current. Accordingly, the first embodiment employs a configuration in which second silicon oxide film 13 of interelectrode insulating film 9 is placed in direct contact with control gate electrode CG in the region above the upper surface of floating gate electrode FG where electric field concentration occurs. In other words, the first embodiment is configured to reduce the thickness of the silicon nitride film in direct contact with the control gate electrode to zero, meaning that the silicon nitride film is dissipated and thus, absent in this region. Accordingly, high electric field leakage current is reduced in the region above the floating gate electrode to improve the programming properties.

However, simply avoiding the direct contact between the control gate electrode and silicon nitride film will increase the risk of programming errors originating from threshold variation of the adjacent cell at the expense of reduced high electric field leakage current. One cause of threshold variation of a memory cell employing an interelectrode insulating film including an ONO stack is the increase in the amount of electrons trapped in the silicon nitride film interposing the top and the bottom oxide. The absence of an upper silicon nitride film in direct contact with the control gate electrode and residing between the control gate electrode and the ONO stack allows increase in the level of leakage current flowing into the lower silicon nitride film during the erase operation, thereby increasing the amount of electron traps in the lower silicon nitride film.

Figure 6:
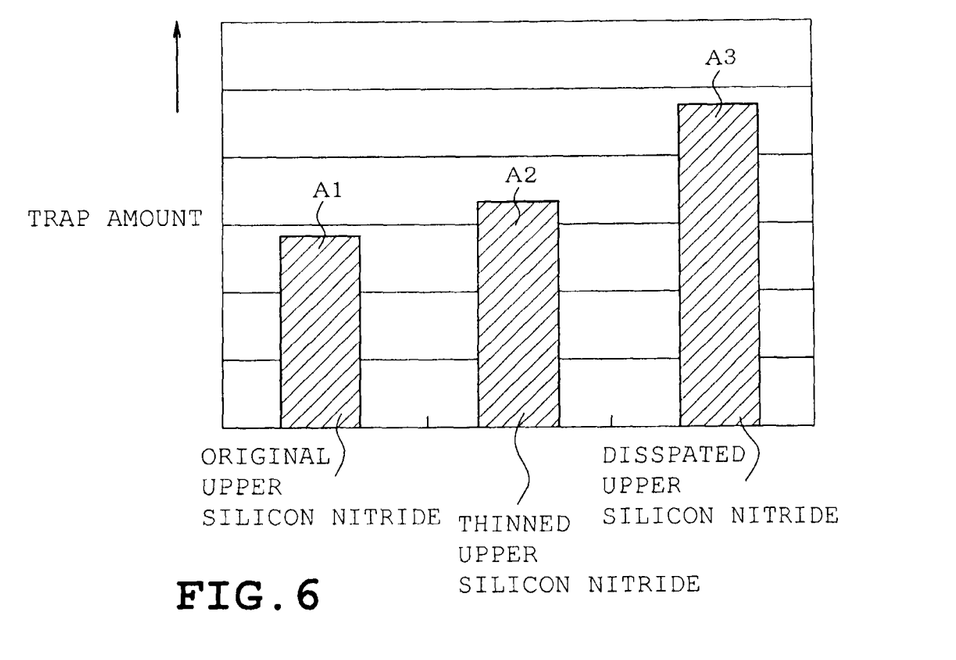
FIG. 6 is a chart plotting the thickness of a second silicon nitride film against the amount of electron traps in an ONON stack.

This is explained by the chart shown in FIG. 6 which shows how the amount of electron traps in an ONON interelectrode insulating film varies with thickness of the upper silicon nitride film which is placed in direct contact with the control gate electrode and serves as the anode side during the erase operation. This upper silicon nitride film of the ONON stack serves as a barrier against electron trapping into the lower silicon nitride as described earlier. The upper silicon nitride film is exemplified as second silicon nitride film 14, whereas the lower silicon nitride film is exemplified as first silicon nitride film 12 in the first embodiment.

Referring to FIG. 6, bar graph A1 indicates the amount of electron traps in the presence of the upper silicon nitride film having a first thickness. Bar graph A2 indicates the amount of electron traps in the presence of the upper silicon nitride film having a second thickness less than the first thickness. Finally, bar graph A3 indicates the amount of electron traps in the absence of the upper silicon nitride film. It can be understood from FIG. 6 that the amount of electron traps increases as the upper silicon nitride film becomes thinner and eventually dissipated. The increase in the amount of electron traps is considered to be attributable to the increase in the leakage tunneling current flowing into the lower silicon nitride film during the erase operation in the absence of the upper silicon nitride film or in the presence of a relatively thin upper silicon nitride film. More specifically, as the upper silicon nitride film, having relatively higher dielectric constant compared to a silicon oxide film, is reduced in physical thickness, the distance in which the electrons tunnel directly is reduced. This increases the amount of leakage tunneling current flowing into the lower silicon nitride film and consequently the amount of trapped electrons.

The electrons trapped in the silicon nitride film, in addition to the electrons injected into the floating gate electrode, also positively affect the programming properties of the cell. Thus, as the width of the element isolation trenches become narrower and the distance between the adjacent cells become smaller, the electrons trapped in the silicon nitride film located in the region above the upper surface of the element isolation insulating film unwantedly varies the programming threshold of the adjacent cell to result in erroneous programming.

The first embodiment, in contrast, is configured such that second silicon oxide film 13 located in the region above the upper surface of floating gate electrode FG establishes direct contact with control gate electrode CG without intervention of the upper silicon nitride film, whereas in the region above the upper surface of element isolation insulating film 5, second silicon nitride film 14, serving as the barrier, establishes direct contact with control gate electrode CG. Thus, during the erase operation, electron trapping in interelectrode insulating film 9 located in the region above element isolation insulating film 5 is inhibited, whereas during the programming operation, the level of leakage current observed in interelectrode insulating film 9 in the region above the upper surface of floating gate electrode FG can be reduced. Thus, the first embodiment suppresses the threshold shifting of the adjacent unintended cell to improve the programming properties.

The configuration of the first embodiment further achieves a controlled formation of a bird's beak which contributes to obtaining the above described improved device properties. For instance, after selectively dissipating second silicon nitride film 14 of interelectrode insulating film 9 from the region above the upper surface of floating gate electrode FG while maintaining the same in the region above element isolation insulating film 5, the remaining steps of the manufacturing process flow are executed to obtain the structure shown in FIG. 4. Then, post oxidation is carried out to typically cure any damages suffered during the foregoing steps. At this instance, the oxidant used in the oxidation may selectively form a birds's beak at the edges of the silicon oxide film which is not sufficiently protected by an oxidant barrier which is, in this case, a silicon nitride film. In the example of the first embodiment, second silicon nitride film 14 in the uppermost layer of interelectrode insulating film 9 is dissipated from the region above the upper surface of floating gate electrode FG to allow the formation of the bird's beak at the edges of second silicon oxide film 13 by design. The bird's beak, in this case, contributes in thickening second silicon oxide film 13 to provide the above described advantages. In contrast, second silicon nitride film 14, remaining along the sidewall of floating gate electrode FG, act in corporation with the underlying first silicon nitride film 12 to protect silicon oxide film 13 from both sides and does not allow the formation of the bird's beak and thus, second silicon oxide film 13 stays relatively thin. Further, an optional layer of silicon nitride film may be added between floating gate electrode and lowermost silicon oxide film, which in this case is silicon oxide film 11, if it is desired to inhibit the formation of bird's beak even more effectively. The above described configuration allows interelectrode insulating film 9 to become thicker in the region above the upper surface of floating gate electrode FG where electric field concentration occurs to relax the electric field and consequently the high electric field leakage current.

The above described first embodiment maybe modified or expanded as follows.

In the first embodiment, second nitride film 14 of interelectrode insulating film 9 was dissipated from the region above the upper surface of floating gate electrode FG. Alternatively, second silicon nitride film 14 may be made relatively thinner in the region above the upper surface of floating gate electrode and relatively thicker in the region above the upper surface of element isolation insulating film 5. Such configuration also provides the advantages substantially identical to those of the first embodiment. That is, the thin second silicon nitride film 14 placed in direct contact with control gate electrode CG in the region above the upper surface of floating gate electrode reduces the flow of high electric field leakage current during the programming operation as shown in FIG. 5, thereby improving the programming properties. In the region above element isolation insulating film 5 on the other hand, the thick second silicon nitride film 14 placed in direct contact with control gate electrode CG serves as a barrier during the erase operation to reduce the amount of electron traps in first silicon nitride film 12 interposing the first and the second silicon oxide films 11 and 13 as shown in FIG. 6, thereby suppressing threshold shifting and consequently erroneous programming in the adjacent cell.

The selective thinning of second silicon nitride film 14 located in the region above the upper surface of floating gate electrode FG will be briefly described through an example in which silicon nitride film 14 is formed by deposition, preferably LP-CVD, as opposed to the radical nitridation employed in the first embodiment. The consequences of employing a deposited silicon nitride film will be later described in detail.

After the formation of second silicon oxide film 13, silicon nitride film 14 is formed above second silicon oxide film 13 by deposition schemes such as LP-CVD. Then, second silicon nitride film 14 located in the region above the upper surface of floating gate electrode FG is thinned by local oxidation to make second silicon nitride film 14 located in the region above element isolation insulating film 5 relatively thicker. The silicon oxide film formed above the thinned second silicon nitride film 14 as the result of the local oxidation is typically removed by wet etching. After formation of interelectrode insulating film 9, conductive layer 10 is further formed above it as done in the first embodiment to obtain second silicon nitride film 14 which is in direct contact with control gate electrode CG and which is relatively thinner in the region above the upper surface of the floating gate electrode FG and relatively thicker in the region above the upper surface of element isolation insulating film 5.

Further in the first embodiment, second silicon nitride film 14 which is dissipated from the region above the upper surface of floating gate electrode FG is left to remain in the region along the sidewall of floating gate electrode FG to reduce the amount of electrons trapped in first silicon nitride film 12, which in turn inhibits threshold shifts and consequently erroneous programming in the adjacent cell. Incase it is required to suppress high electric field leakage current in the region along the sidewall of floating gate electrode FG, second silicon nitride film 14 is desirably dissipated from such region as well.

Further, the length or the height of second silicon nitride film 14 to remain along the sidewall of floating gate electrode FG may be controlled depending upon device requirements. Incase the requirement to suppress electron traps within first silicon nitride film 12 is prioritized over suppression of high electric field leakage current, second silicon nitride film 14 may be made to remain at a relatively higher elevation. In case the requirement to suppress high electric field leakage current is to be prioritized over suppression of electron traps, second silicon nitride film 14 may be made to remain at a relatively lower elevation.

In the first embodiment, first silicon nitride film 12 residing below second silicon nitride film 14 at the uppermost layer of the ONON stack was interposed between first silicon oxide film 11 and second silicon oxide film 13. In an alternative embodiment, first silicon nitride film 12 maybe replaced by high dielectric constant films such as a alumina film and hafnium oxide film that exhibit higher dielectric constant compared to a silicon nitride film. In another alternative embodiment, a stack of a high dielectric constant film and a silicon oxide film may be provided below second silicon nitride film 14. Such configuration also provides a structure in which the high dielectric constant film interposes two silicon oxide films in the region above the upper surface of element isolation insulating film 5. In this case, element isolation insulating film 5 typically comprising as silicon oxide film serves as the bottom oxide film. By dissipating or thinning silicon nitride film 14 in the region above the upper surface of floating gate electrode FG and maintaining it in the region above the upper surface of element isolation insulating film 5, the alternative embodiment will also provide suppressed high electric field leakage current during programming while suppressing electrons traps in the high dielectric constant film interposing the silicon oxide films during erasing.

Further in the first embodiment, second silicon nitride film 12 located in the region along the sidewall of floating gate electrode FG and above the upper surface of element isolation insulating film 5 is placed in direct contact with control gate electrode CG. However, if risks of threshold shifts originating from increase in fixed charge and increased interface energy level are impermissible, a thin silicon oxide film not more than 1 nm in thickness may be provided above second silicon nitride film 14 for controlling the interface properties. The 1 nm or thinner silicon oxide film may be arranged to form through the local oxidation performed to thin second silicon nitride film 14.

The ONON structure employed in interelectrode insulating film 9 of the first embodiment may further incorporate an additional silicon nitride film in the bottommost layer of the stack to employ a NONON structure. Further, interelectrode insulating film 9 may comprise a stack of silicon nitride film/silicon oxide film/high dielectric constant film/silicon oxide film/silicon nitride film.

First and second silicon oxide films 11 and 13 being formed by LP-CVD in the first embodiment may be formed by other deposition schemes such as ALD (Atomic Layer Deposition) or by oxidation. First silicon nitride film 12 formed by LP-CVD may be formed by other deposition schemes such as ALD or by radical nitridation.

Second silicon nitride film 14 formed by radical nitridation in the first embodiment may be formed by deposition schemes such as LP-CVD and ALD. The Si source used in the LP-CVD and ALD may be inorganic materials such as disilane, DCS (Dichlorosilane, $SiH_2Cl_2$), or HCD (Hexa Chloro Dislane, $Si_2Cl_6$) or organic materials comprising a bond of Si and amino group. The N source may be $NH_3$ or radical nitrogen, etc. A silicon nitride film formed by deposition, as compared to a silicon nitride film formed by radical nitridation, is easily oxidized. Thus, when locally oxidizing second silicon nitride film 14 located in the region above the upper surface of floating gate electrode FG, second silicon nitride film 14 located in the regions along the sidewall of floating gate electrode FG and above the upper surface of element isolation insulating film 5 may also get oxidized, resulting in a thin silicon oxide film formed at the uppermost layer of interelectrode insulating film 9. Such silicon oxide film, if controlled to 1 nm or thinner, will not significantly impact the device properties. However, if the presence of such silicon oxide film is impermissible for coupling control etc., the silicon oxide film may be removed by an isotropic etching scheme such as wet etching.

The local oxidation of the first embodiment employed plasma oxidation. Alternatively, oxidation may be carried out by generating plasma through interaction of the magnetic field of a permanent magnet and high frequency electric field applied to RF (Radio Frequency) electrode. Further, the local oxidation is not limited to radical oxidation but may employ other oxidation schemes since the advantages of the first embodiment can be obtained as long the oxidation can be localized. The local oxidation can be performed any number of times and in any amount to control the thickness of or dissipate second silicon nitride film 12 located in the region above the upper surface of floating gate electrode FG as desired.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   an element isolation region defined in the semiconductor substrate and having an element isolation insulating film formed therein;
   an active region defined in the semiconductor substrate delineated by the element isolation region;
   a gate insulating film formed in the active region;
   a charge storage layer formed above the gate insulating film;
   a multilayered interelectrode insulating film formed in a first region above an upper surface portion of the element isolation insulating film, a second region along a sidewall portion of the charge storage layer, and a third region above an upper surface portion of the charge storage layer; and
   a control electrode layer formed above the interelectrode insulating film;
   wherein the interelectrode insulating film comprises a first stack including a first silicon nitride film or a first high dielectric constant film interposed between a first silicon oxide film and a second silicon oxide film formed above the first silicon oxide film or a second stack including a second high dielectric constant film and a third silicon oxide film formed above the second high dielectric constant film, and a second silicon nitride film formed between the control electrode layer and the first or the second stack and,
   wherein the second silicon nitride film is absent in the third region.

2. The device according to claim 1, wherein a silicon oxide film of 1 nm or thinner resides between the second silicon nitride film and the control electrode layer.

3. The device according to claim 1, wherein the second silicon oxide film of the first stack or the third silicon oxide film of the second stack is relatively thicker in the third region than in the first and the second region.

4. The device according to claim 1, wherein the second silicon nitride film is at least partially absent in the second region.

5. The device according to claim 1, wherein the second silicon oxide film of the first stack or the third silicon oxide film of the second stack includes a bird's beak in the third region.

6. The device according to claim 1, wherein the interelectrode insulating film further includes a silicon nitride film between the charge storage layer and the first or the second stack.

7. The device according to claim 1, wherein the first and the second high dielectric constant film comprise an alumina film or a hafnium oxide film.

* * * * *